(12) United States Patent
Brubaker

(10) Patent No.: US 7,639,168 B1
(45) Date of Patent: Dec. 29, 2009

(54) SYSTEMS AND METHODS FOR SWITCH RESISTANCE CONTROL IN DIGITAL TO ANALOG CONVERTERS (DACS)

(75) Inventor: James Lee Brubaker, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/671,628

(22) Filed: Feb. 6, 2007

(51) Int. Cl.
H03M 1/78 (2006.01)
(52) U.S. Cl. .................. 341/154; 341/118; 341/119; 341/120; 341/121; 341/144
(58) Field of Classification Search ............. 341/144, 341/154, 118–121
See application file for complete search history.

(56) References Cited

U.S. PATENT DOCUMENTS

| | | | | | |
|---|---|---|---|---|---|
| 3,755,807 | A | * | 8/1973 | Brown | 341/136 |
| 4,249,127 | A | * | 2/1981 | Morgan | 324/646 |
| 4,521,765 | A | * | 6/1985 | Wang et al. | 341/154 |
| 4,800,365 | A | * | 1/1989 | White et al. | 341/119 |
| 4,942,397 | A | * | 7/1990 | Real | 341/118 |
| 5,525,986 | A | * | 6/1996 | Kovacs et al. | 341/136 |
| 5,831,566 | A | * | 11/1998 | Ginetti | 341/144 |
| 6,178,388 | B1 | * | 1/2001 | Claxton | 702/107 |
| 6,486,817 | B1 | * | 11/2002 | Okada et al. | 341/154 |
| 6,628,216 | B2 | * | 9/2003 | Chen et al. | 341/120 |
| 6,833,802 | B1 | * | 12/2004 | Schrodinger | 341/154 |
| 6,885,328 | B1 | * | 4/2005 | Kao et al. | 341/144 |
| 6,995,701 | B1 | * | 2/2006 | Churchill et al. | 341/154 |
| 7,034,735 | B1 | * | 4/2006 | Copley | 341/154 |
| 2001/0020910 | A1 | * | 9/2001 | Noro et al. | 341/154 |

* cited by examiner

Primary Examiner—Linh V Nguyen
(74) Attorney, Agent, or Firm—McDermott Will & Emery LLP

(57) ABSTRACT

A switch signal generator circuit that may form part of a digital to analog converter is provided. The switch signal generator circuit may include a first switch that controls a high reference gate voltage. The high reference gate voltage may provide the ON state voltage for a plurality of switches that control the coupling of a high reference voltage to the digital to analog converter. The switch signal generator circuit may include a second switch that controls a low reference gate voltage. The low reference gate voltage may provide the ON state voltage for a plurality of switches that control the coupling of a low reference voltage to the digital to analog converter. The switch signal generator circuit may also include a resistor. In one embodiment of the invention, a current conducted by the first switch and/or a current conducted by the second switch may each be proportional to a current conducted by the resistor. One of the switches in the switch generator circuit may be a P channel switch. One may be an N channel switch. In one embodiment of the invention, current conducted by the first switch may be proportional to the current conducted by the second switch. Also the current conducted by the first switch may be proportional to temperature.

30 Claims, 5 Drawing Sheets

SYSTEMS AND METHODS FOR SWITCH RESISTANCE CONTROL IN DIGITAL TO ANALOG CONVERTERS (DACS)

BACKGROUND OF THE INVENTION

This invention relates to improving the performance of circuits that include switches and other components, such as resistors, where switch resistances of the switches are a significant error source. More specifically, this invention relates to improving the performance of MOS-switch based digital-to-analog converters (DACs).

PRIOR ART

To better understand this problem as it occurs in DACs, a short introduction to DACs will be presented. Then, the relationship between the problem stated above and DACs will be discussed.

DACs translate binary signals from computers or other discrete circuitry into proportional analog voltage levels. DACs are commonly used to drive analog devices such as meters, motor controllers, or audio circuitry.

The binary weighted resistor network DAC is a simple method of converting digital bits from a digital signal into an analog signal. For the circuit 100 shown in FIG. 1, a binary signal is applied to gating circuits 118 that drive analog switches 102, 104, 106 and 108. When a binary signal of 0000 is applied to the switches, all the switches are open so no voltage is applied to the op amp 122. At this point, the output is 0 volts. When a 0001 binary signal is applied, switch 102 closes and −10 volts is applied to resistor 110. Because the input of op amp 122 represents virtual ground, there is 10 volts across the 8000 ohm resistor 110. That causes 10V/8000 ohm, or 1.25 milliamps, to flow through the 800 ohm feedback resistor 120. By Ohm's law, the voltage across resistor 120 would be 800 ohm×1.25 milliamps, or 1 volt.

When the binary signal changes to 0010, switch 102 opens and switch 104 closes. That causes 2.5 milliamps (10 volts/4000 ohm) to flow through resistor 120. The voltage across resistor 120 is then 800 ohms×2.5 milliamps, or 2 volts. A binary 0100 would create 4 volts at the output, and so on.

A binary-weighted resistor network DAC is not practical, however, for applications requiring much more than 4 bits of resolution because the range of resistor values required is very large and difficult to fabricate accurately. An R 2R ladder network has become the DAC of choice, therefore, in most applications.

The R 2R ladder network is capable of producing binary weighted voltages with resistors having only two different values of resistance arranged in a type of network known as a binary ladder, shown in FIG. 2A. In this circuit, a series of latches 240 are used to drive analog switches 202, 204, 206 and 208.

The R 2R ladder operates such that, when an individual switch is closed, each "rung" on the R 2R ladder delivers a current to the virtual ground node. Because of the arrangement of resistors 210, 212, 214, 216, 218, 220, 222 and 224, the current delivered by each successive rung is binarily weighted. Thus, each successive switch going down the ladder, when connected to VREF, produces a current, which, in turn, produces half the output voltage of the switch above it.

For example, when a binary 0000 is transmitted to latches 240, this connects all of the switches to ground and disconnects VREF from the output. This causes 0 volts to appear at the output of the op amp 230. A binary signal of 1000 will connect switch 202 to VREF, thus activating the MSB (most significant bit). By Ohm's law, the current flowing through resistor 210 will cause a 5 signal to appear at the output. A signal of 0100 connects switch 202 to ground and connects switch 204 to VREF and results in a −VREF/2 volt signal at the output.

The primary advantage of the R-2R binary-weighted ladder design over the binary-weighted resistor network DAC is its use of resistors having only two resistor values. As a result, it is a simple matter to process virtually any number of bits simply by adding additional "rungs" to the ladder.

R-2R Ladder DACs operating in the current steering (IOUT) mode, e.g. AD7520 circa 1973, have switches normally tied to Ground, and other switches normally maintained at a virtual ground by an external I-V converter op amp. High precision signal conversion typically requires an accurate ratio between switches. Since all switches in the AD7520 are N-channel MOSFET switches and are biased at about the same voltage, switch resistance (hereinafter alternatively referred to as "R (switch resistance)") matching is achieved by scaling the N-channel widths of the MOSFET switches.

R-2R Ladder DACs operating in the voltage switching (VOUT) mode have switches biased at REFHI (Vref) and well as REFLO (Ground). Many early DACs of this type used N-channel switches with approximately the same VGS (ON) at both REFHI and REFLO. This requires considerable headroom from Vref to VDD, and also limits the VREF range.

Prior art R-2R Ladder VOUT mode DACs with an extended VREF range included the MAX541/542 and related parts (e.g. AD5541/5542 and MAX5441/5442).

These DACs generally use complementary (P-channel and N-channel) switches at Vref REFHI, and N-channel switches at Ground (REFLO).

PROBLEMS OF PRIOR ART

The R (switch resistance) control circuits used to extend the VREF range as described above, tend to have significant variations in R (switch resistance) tracking due to bias conditions (VDD and Vref variations), temperature, etc. This causes undesirable variations in DAC linearity over the specified VDD, Vref and temperature ranges.

Typically, all of the prior art resistor ladder DACs discussed above generally require a very large range of R (switch resistance) between the More Significant Bits (MSB's) and the Less Significant Bits (LSBs). This forces some very undesirable trade-offs in important parameters such as die area, linearity, and glitch settling, especially in VOUT mode DACs.

SUMMARY OF THE INVENTION

A digital to analog converter according to the invention is provided. The converter may include a first switch. The first switch, which may be a MOSFET switch, may control a high reference gate voltage. The high reference gate voltage may provide the ON state voltage for a plurality of switches that control the coupling of a high reference voltage to the digital to analog converter. Thus, the impedance of the plurality of switches preferably tracks the impedance of the first switch. The converter may also include a second switch that controls a low reference gate voltage. The low reference gate voltage may provide the ON state voltage for a plurality of switches that control the coupling of a low reference voltage to the digital to analog converter. Thus, the impedance of this plurality of switches—i.e., that control the coupling of a low reference voltage to the digital to analog converter—preferably tracks the impedance of the second switch. The converter may also include a thin film resistor. It should be noted that the thin film resistor referred to herein may also, in alternative embodiments of the invention, be implemented as a polysilicon resistor instead of as a thin film resistor, or as any other suitable impedance structure. Preferably, a current conducted by the first switch and a current conducted by the second switch may be proportional to a current conducted by the thin film resistor. One purpose obtained by a circuit according to the invention may be to control the resistances of the components in the network with respect to one another—i.e., to introduce a preferably predetermined relationship between the resistances of the components of the circuit with respect to one another—and, preferably, with respect to the resistor network.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DESCRIPTION OF THE DISCLOSURE

One preferred embodiment of the disclosed invention uses N-channel switches at REFLO and P-channel switches at REFHI. Both N-channel and P-channel switches may be biased to track a single thin film resistance or a plurality of thin film resistances. The proposed circuit preferably has low sensitivity to Vref, VDD and temperature variations. The low sensitivity improves some of the problems described above. More specifically, because R (switch resistance) tracks R (thin film), switch resistance can be balanced with thin film resistance, which removes the requirement for an extremely wide range of R (switch resistance) values and improves or eliminates the second problem with the prior art discussed above. Since R (switch resistance) tracks R (thin film) (as is shown in greater detailed below), linearity errors due to switch geometry mismatch can preferably be removed when linearity is trimmed, and (unlike prior art) should preferably stay 'trimmed out' when VDD, Vref and temperature vary.

In another embodiment of the invention, P-channel R (switch resistance) can be designed to track N-channel R (switch resistance). This alternate proposed circuit significantly reduces the R (switch resistance) control circuits sensitivity to bias conditions (VDD and Vref) and temperature, which improves the first problem of the prior art discussed above.

Figure 1:
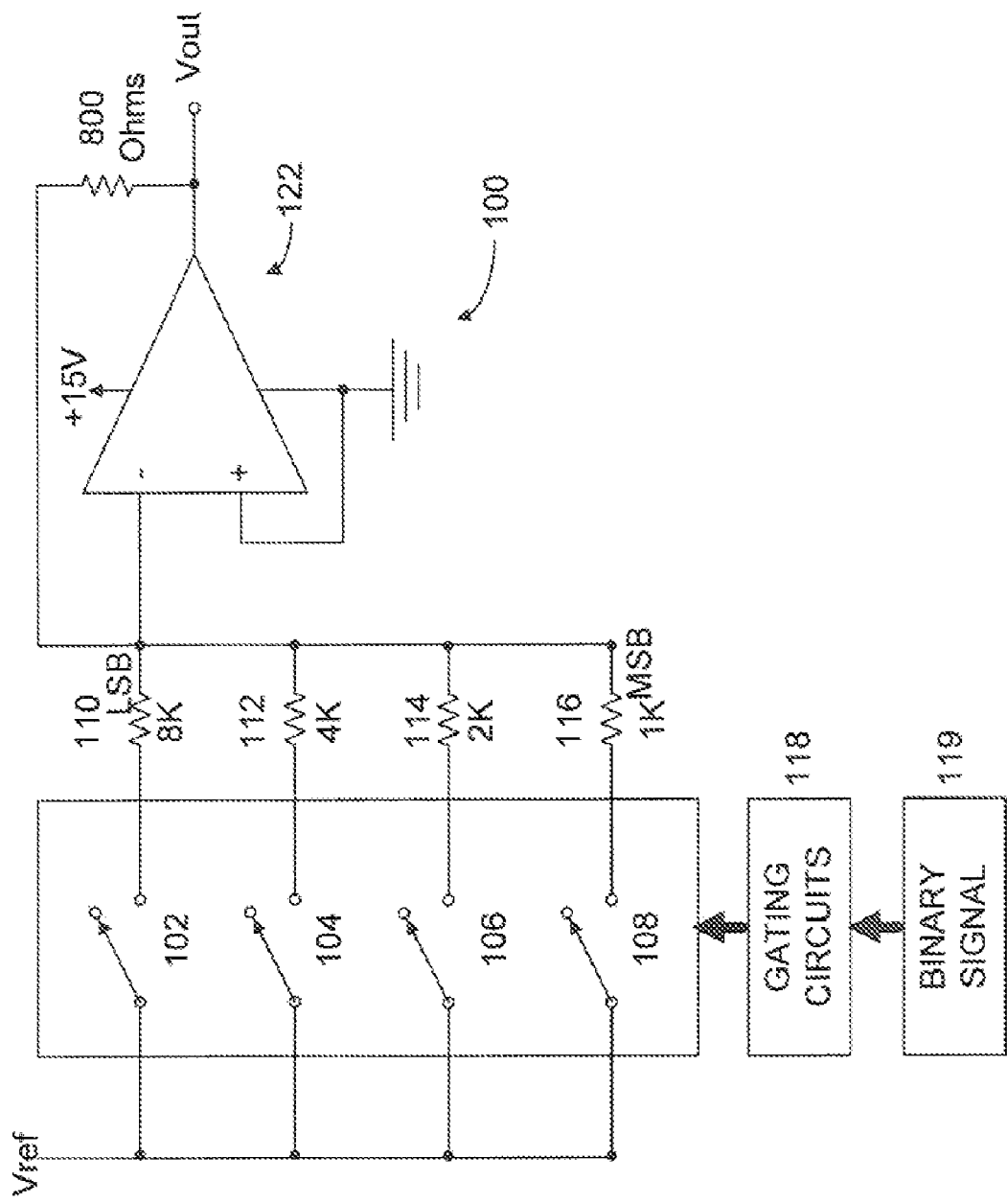
FIG. 1 is a circuit diagram of a conventional binary weighted resistor-network DAC.
Figure 2A:
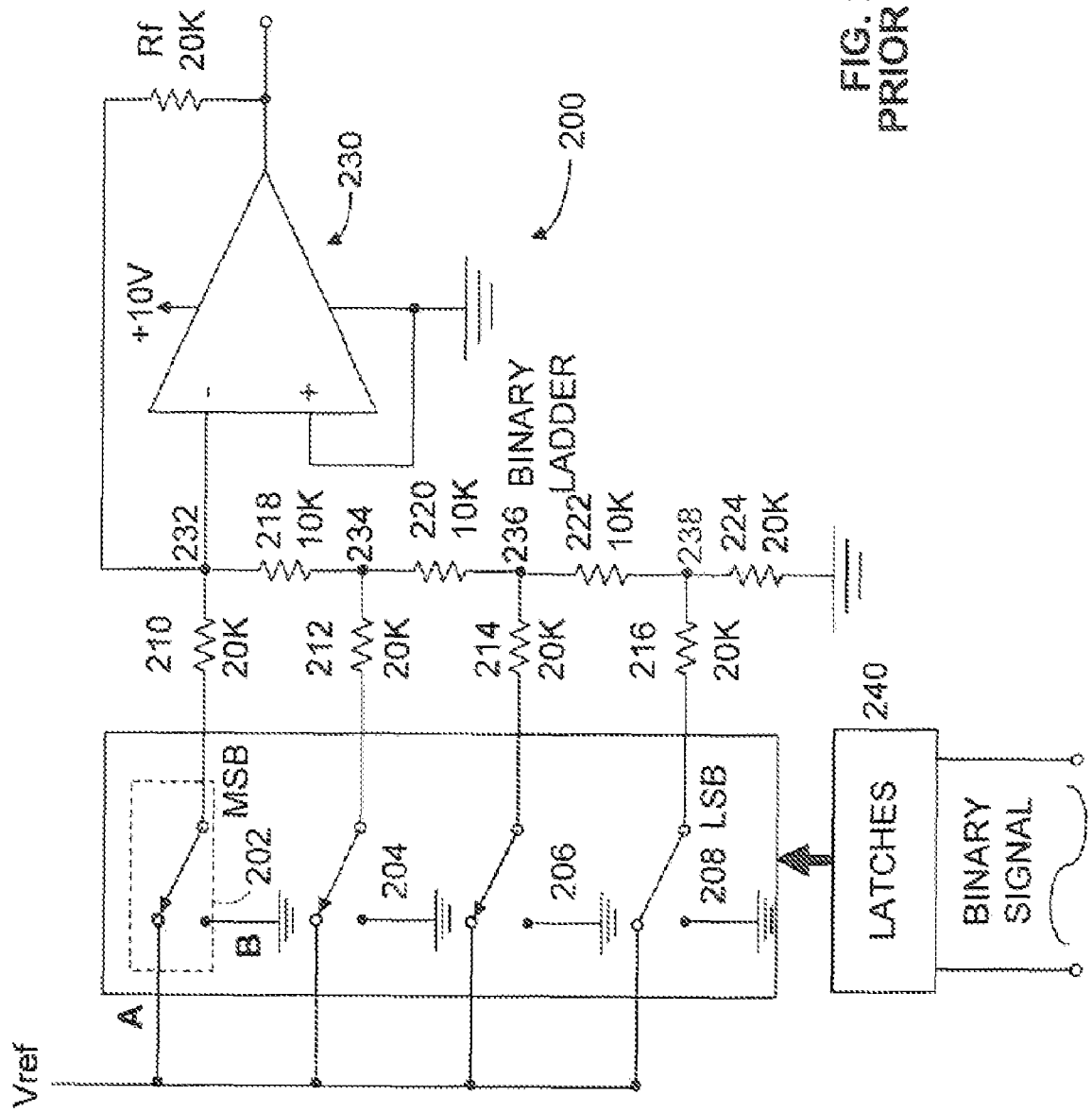
FIG. 2A is a circuit diagram of a conventional R-2R ladder-network DAC.
Figure 2B:
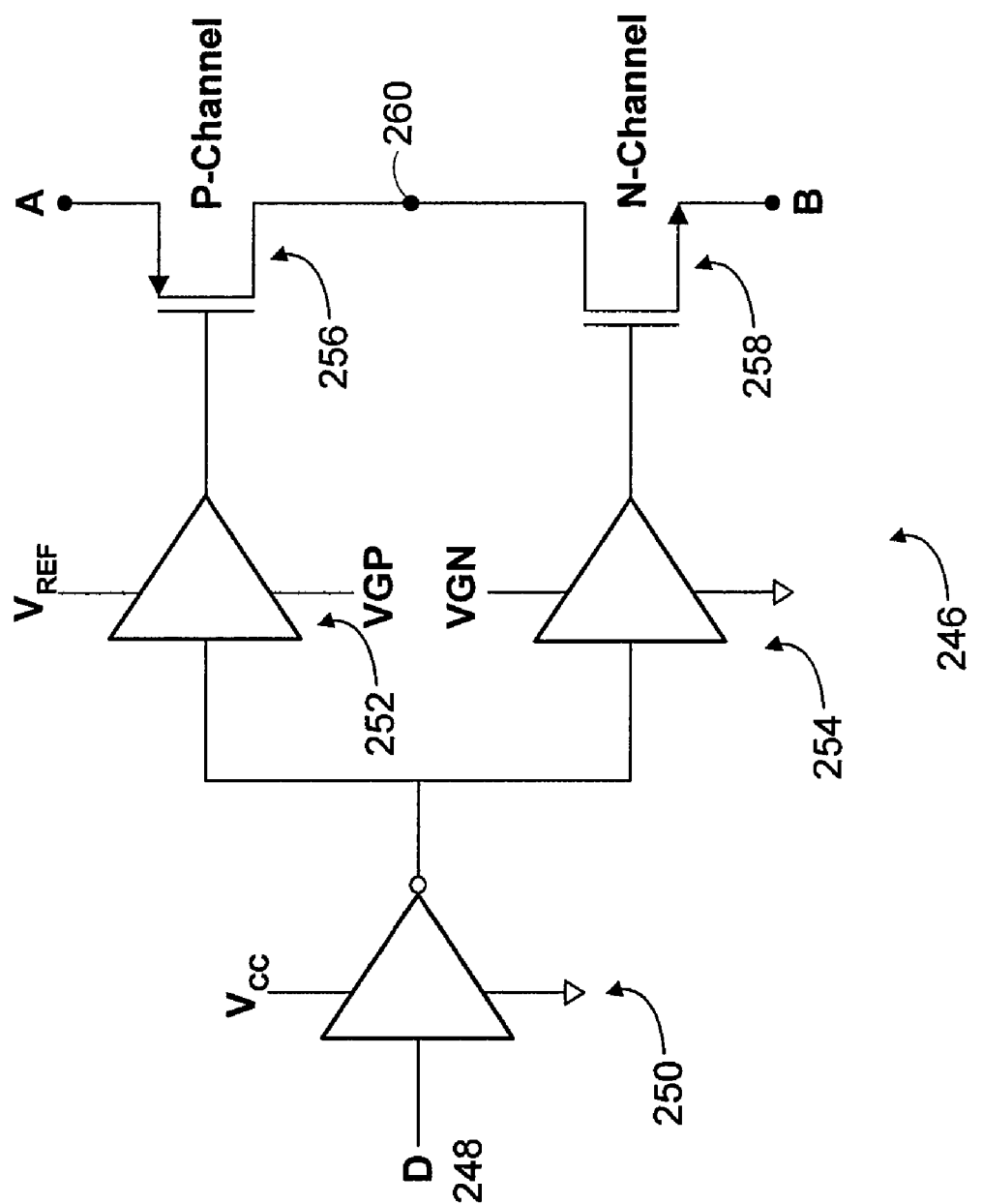
FIG. 2B is a circuit diagram of a switch for use in the R-2R ladder-network DAC shown in FIG. 2A according to the invention.

A exemplary circuit to which the above two embodiments can be applied is explained. FIG. 2B shows a detailed schematic diagram of an exemplary circuit 246 that may be used to implement switch 202 in FIG. 2A in this embodiment. Circuit 246 preferably includes a control signal 248 (preferably generated by at least one latch as shown in latches 240 in FIG. 2A) and buffer 250. Buffer 250 may be coupled to Vcc (the supply voltage) and to ground. Control signal 248 preferably controls the operation of P-channel driver 252 and N-channel driver 254. Depending on the control signal, either VGP (the high reference gate voltage) is coupled to the gate of P-channel transistor 256 which couples A to output node 260, or VGN (the low reference gate voltage) is coupled to the gate of N-channel transistor 258, which couples B to output node 260. Node 260 shown in FIG. 2B corresponds to the node of switch 202 that is coupled to resistor 210 shown in FIG. 2A. To reiterate, circuit 246 is a detailed schematic of one embodiment of a circuit that may be used to implement switch 202 shown in FIG. 2A.

DESCRIPTION OF OPERATION

Figure 3:
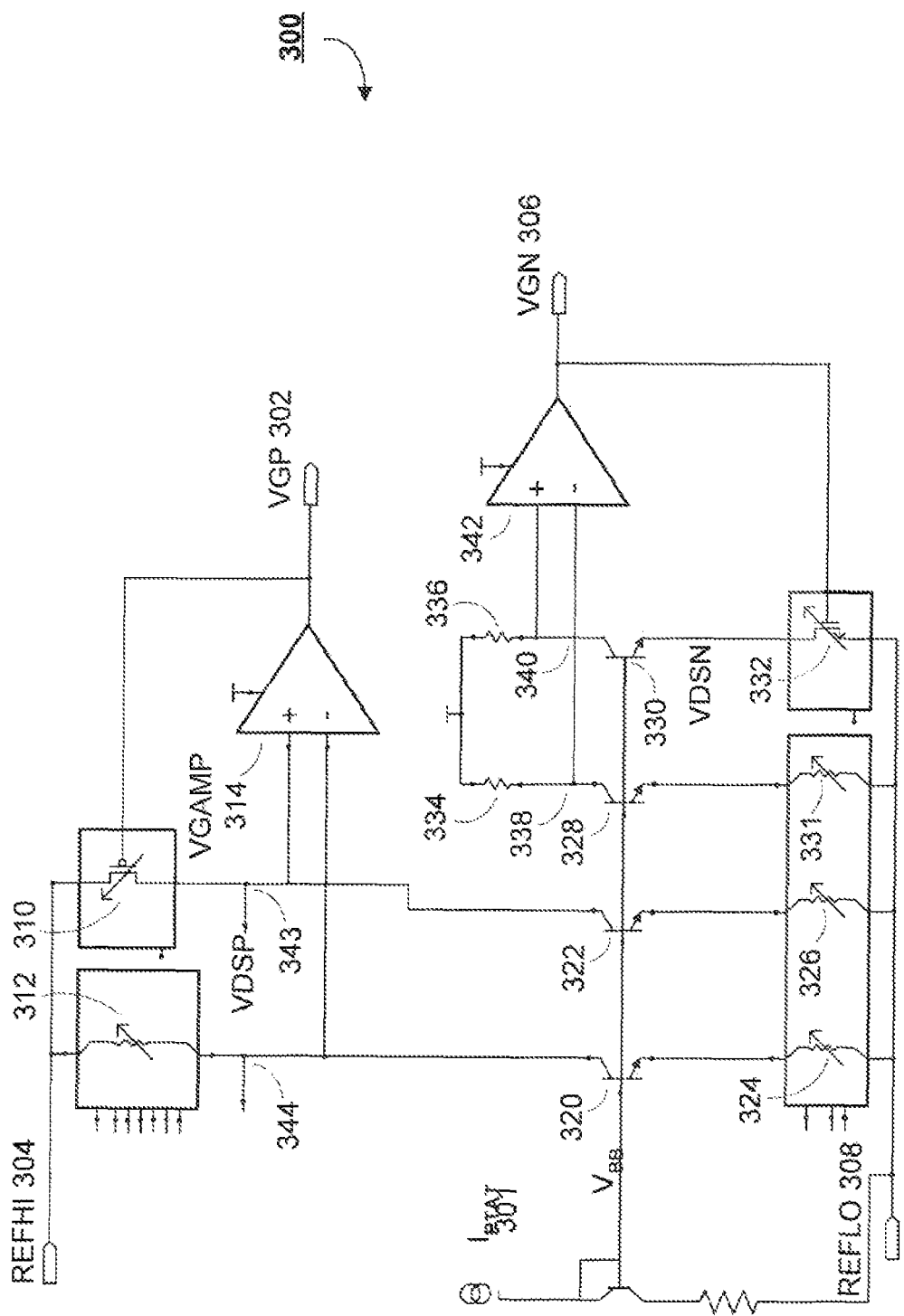
FIG. 3 is a schematic diagram of a switch signal generator circuit according to the invention.

A. P-channel R (switch resistance) and N-channel R (switch resistance) Tracks Thin Film:

FIG. 3 shows a simplified version of VGPVGN generator circuit 300 according to the invention. VGP 302 is the "ON" voltage for P channel switches to REFHI 304 (REFHI 304 is applied to node A in FIG. 2B). VGN 306 is the "ON" voltage for the N channel switches to REFLO (GND) 308 (REFLO 308 is applied to node B in FIG. 2B). VGPVGN generator circuit 300 may be used to generate signals that control the operation of a switch such as switches 202, 204, 206, and 208 in FIG. 2A where these switches include a P-channel switch to connect to Vref and an N-channel switch to connect to ground.

Specifically, VGP 302 may be used as ON state gate voltage for the DAC REFHI switches (switch 256 shown in FIG. 2B), which may be P-channel only and are composed preferably of units having the same width/length ratio as the units forming P-channel switch 310.

V (drain-source) switch 310 may be nominally ~20 mV to 24 mV at room temperature in one embodiment, and, preferably should not be too large, in order to minimize the systematic error caused by Vds versus (VGS-VTh)=Von. Compared to a DAC switch with Vds~0 v, the effective Von of switch 310 is reduced by Vds/2, and the effective VSB is Vds/2, both of which may require a slightly increased VGS to match Rds of P1 310 to resistor 312.

In order to reduce the variation of the aforementioned effect across the entire temperature range in which the circuit typically operates, one may choose to use a reference current that varies with temperature. The reference current preferably is conducted by the thin film resistor. In one embodiment of the invention, a controlled, PTAT (proportional to absolute temperature) bias current 301 which may be proportional to R (thin film) and may be derived from a bandgap reference circuit as is known in the art, is mirrored to inject equal currents into P-channel switch 310, which is tied to REFHI 304, and a reference thin film resistor 312. Depending on the characteristic of the semiconductor utilized, the current that varies with temperature may vary either as a PTAT or in some other suitable variation with temperature. An op amp, VGPAMP 314, adjusts its output voltage, VGP 302, until VDSP node 343 preferably equals node 344, so R (switch resistance) of switch 310 preferably equals the resistance of resistor 312.

The output of VGAMP 314 is VGP 302. VGP 302 can be used as ON state gate voltage for the DAC REFHI switches (shown in FIG. 2B as device 256), which are preferably P-channel and are composed of units having the same width to length ratio as the units forming switch 310.

The equal current sources flowing into switch 310 and resistor 312 may be generated by NPN transistors 320 and 322 with degeneration resistors 324 and 326. The same base node, VBB, may go to transistors 320, 322, 328 and 330. Transistors 328 and 330 include emitters tied to resistor 331 and the drain of N-channel transistor 332 (VDSN node). The collectors of transistors 328 and 330 may be tied to preferably matched resistors 334 and 336, forming a precision common base amplifier.

In this embodiment of the invention, nodes 338 and 340 are tied to the differential inputs of an op amp, VGNAMP 342, which adjusts its output voltage, VGN 306, until node 338 preferably equals node 340. Node 343 preferably can equal node 344, so R (switch resistance) of switch 310 can equal the resistance of resistor 331.

The output of VGNAMP 342 is VGN 306. VGN can be used as ON state gate voltage for the DAC REFLO switches (see N-channel transistor 258 in FIG. 2B), which are preferably N-channel and are composed of units having the same width to length ratio as the units forming switch 332.

This circuit according to the invention can achieve precise control and matching at least between the currents and voltages applied to switch 310, resistor 312, N-channel switch 332 with respect to resistor 331, and also P-channel switch 310 with respect to switch 332 and resistor 331.

Resistors 312, 324, 326, and 331 as well as P-channel switch 310, and N-channel switch 332 may optionally be made trimmable in order to adjust for the effects of mismatch in these elements, or to compensate for the effects on switch resistance of process variation or mismatches in other circuit elements.

For example, if resistors 312, 324, 326, and 331 are all trimmed by the same proportion, the effect may be to change both the P-channel switch resistance and N-channel switch resistance by the same proportion with respect to the thin film resistance. Also, if P-channel switch 310 is trimmed relative to N-channel switch 332, such as by changing the effective number of unit values of width/length (of the transistor), then the relative resistance of the P-channel switches versus the N-channel switches will be adjusted.

B. N-channel R (switch resistance) Preferably Tracks P-channel R (switch resistance):

A modification (or alternative embodiment) to the circuit shown above may control the R (switch resistance) ratio between switches operating under different bias conditions. For example, such a circuit may include different bias conditions for R (switch resistance) (N-channel) with respect to R (switch resistance) (P-channel) for the DAC example above. This embodiment may be more stable over varying operating conditions than prior art.

Figure 4:
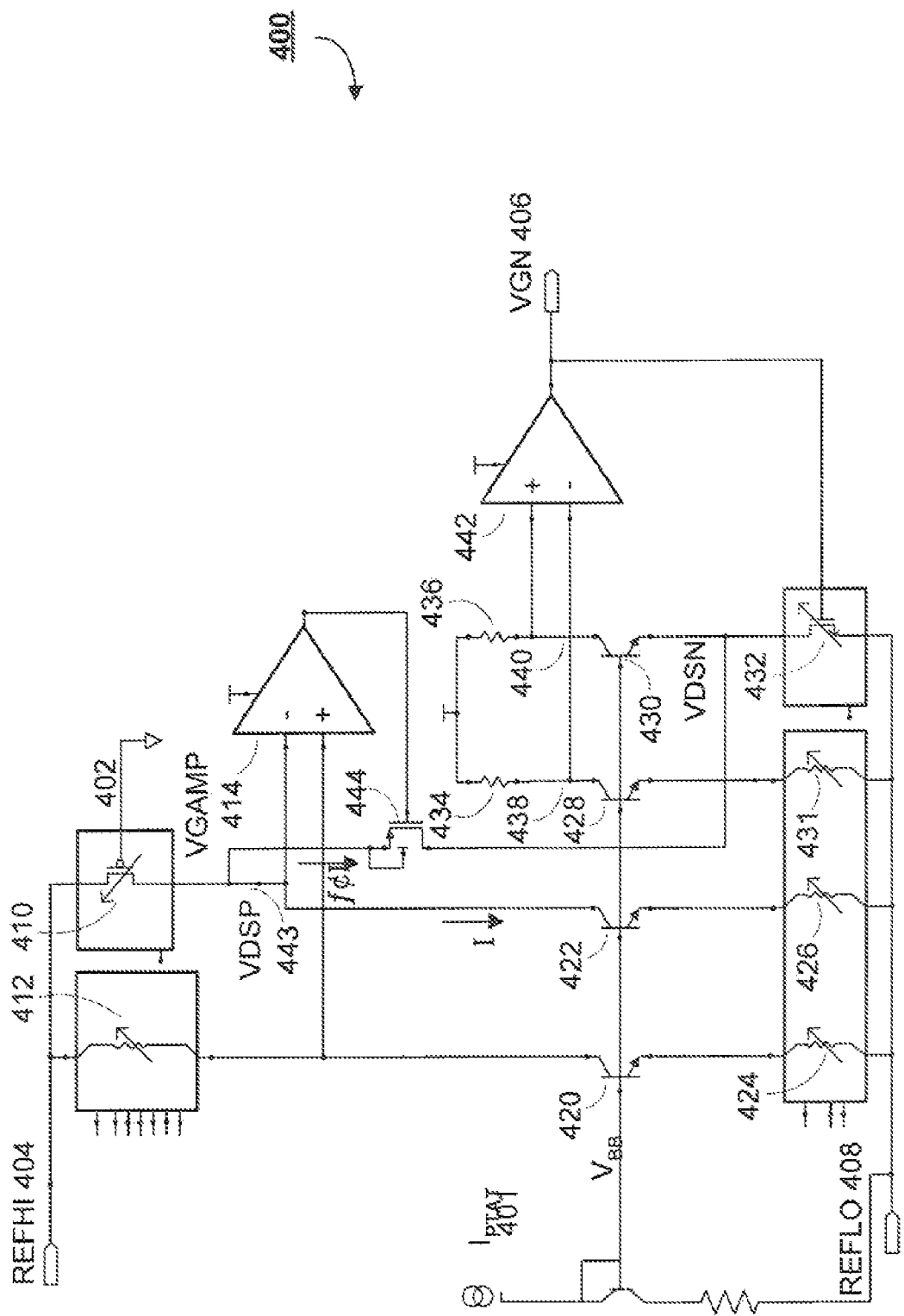
FIG. 4 is a schematic diagram of another switch signal generator circuit according to the invention.

FIG. 4 shows a circuit in which the P-channel gate voltage, VGP 402, may be tied to ground.

Alternatively, VGP 402 can be tied to some other voltage, such as, for example, a voltage driven by a source outside the circuit shown. The same voltage VGP 402 can also be used as ON state gate voltage for the DAC REFHI switches (shown in FIG. 2B as device 256), which are preferably P-channel and are composed of units having the same width to length ratio as the units forming switch 410.

Device sizes for this circuit may be chosen so that R (switch resistance) of switch 410 may be preferably always less than the resistance of resistor 412, so the voltage drop across switch 410 is preferably always less than the resistance of resistor 412. Op amp VGAMP 414 may control an additional current, ΔI, that flows into switch 410 (along with a current I) via transistor 444, preferably making Vds (switch 410)=V (resistor 412).

The VGN control circuit may function similarly to the "R (switch resistance) tracks thin film" circuit described in Section A above in the portion of the specification corresponding to FIG. 3, except that the same current, delta I, also flows into switch 432. With appropriate choices of device values and current ratios—e.g. resistor 431 about equal to resistor 412, and I (register 431)=I (register 412), this circuit causes R (switch resistance) of switch 432 to differ from resistor 431 by preferably the same ratio that R (screech resistance) of switch 410 differs from register 412. Therefore, R (switch resistance) of switch 432 can preferably be equal to R (switch resistance) of switch 410. Therefore, according to the invention, a number of P-channel switches biased at VREF with gate voltages VGP and N-channel switches biased at REFLO (GND) with gate voltages VGP may have proportional R (switch) values.

Further applications may also be enabled by the R (switch resistance) Tracking Rtf circuit according to the invention. For example, a complementary controlled resistance transmission gate is possible using the circuits of the invention.

In such circuits, resistance may preferably be constant vs. R (thin film) when tied to a node that is switched between REFHI and REFLO.

This may be implemented in a variable resistance trimadac (see commonly assigned co-pending U.S. patent application No. 11/671,666 "System and Methods for Providing Compact Digitally Controlled Trim of Multi-Segment Circuits" disclosure which is hereby incorporated by reference herein in its entirety).

Other embodiments of the invention may include circuits that provide compact, precise, stable variable resistance trim circuits in which small size PMOS switches (near REFHI) and NMOS switches (near REFLO) have significant witch resistance, but do not cause error because switch resistance tracks thin film resistance.

This may also be used to allow compact, precise trimming of the VGP 302 and VGN 306 switch bias voltage circuits.

With respect to yet other embodiments of the invention, digitally controlled span and configuration adjustments that require switching resistive legs normally too sensitive to switch resistance errors (unless switches were made impractically large) may also be made practical according to the invention because switch resistance can be made to track thin film resistance (for switches tied to either REFHI or REFLO).

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A digital to analog converter comprising:
   a first switch that controls a high reference gate voltage, the high reference gate voltage that is the ON state voltage for a plurality of switches that control the coupling of a high reference voltage to the digital to analog converter;
   a second switch that controls a low reference gate voltage, the low reference gate voltage that is the ON state voltage for a plurality of switches that control the coupling of a low reference voltage to the digital to analog converter; and
   a resistor, wherein each of an impedance value of the first switch and an impedance value of the second switch tracks an impedance value of the resistor.

2. The digital to analog converter of claim 1, wherein the first switch is a P-channel switch.

3. The digital to analog converter of claim 1 wherein the second switch is an N-channel switch.

4. The digital to analog converter of claim 1 wherein the low reference voltage is generated with respect to ground.

5. The digital to analog converter of claim 1 wherein the high reference voltage is generated with respect to a supply voltage.

6. The digital to analog converter of claim 1 wherein the current conducted by the first switch is proportional to the current conducted by the second switch.

7. The digital to analog converter of claim 1 wherein the current conducted by the first switch is proportional to absolute temperature.

8. The digital to analog converter of claim 1 wherein the current conducted by the second switch is proportional to absolute temperature.

9. A digital to analog converter comprising:
a first switch;
a second switch that controls a reference gate voltage, the reference gate voltage that is the ON state voltage for a plurality of switches that control the coupling of a reference voltage to the digital to analog converter; and
a resistor, wherein each of an impedance value of the first switch and an impedance value of the second switch tracks an impedance value of the resistor.

10. The digital to analog converter of claim 9 wherein the first switch is a P-channel switch.

11. The digital to analog converter of claim 9 wherein the second switch is an N-channel switch.

12. The digital to analog converter of claim 9 wherein the low reference voltage is generated with respect to ground.

13. The digital to analog converter of claim 9 wherein the high reference voltage is generated with respect to a supply voltage.

14. The digital to analog converter of claim 9 wherein the current conducted by the first switch is proportional to the current conducted by the second switch.

15. The digital to analog converter of claim 9 wherein the current conducted by the first switch varies in response to changes in temperature.

16. The digital to analog converter of claim 9 wherein the current conducted by the second switch is proportional to temperature.

17. The digital to analog converter of claim 9 wherein a gate voltage of the first switch is tied to a reference voltage.

18. A method for controlling a plurality of switch resistance in a digital to analog converter, the method comprising:
conducting a current through a resistor;
conducting a current through a P-channel switch, an impedance value of the P-channel switch tracking an impedance value of the resistor; and
conducting a current through a N-channel switch, the impedance value of the N-channel switch tracking the impedance value of the resistor.

19. The method of claim 18 wherein the current conducted by the P-channel switch is proportional to the current conducted by the N-channel switch.

20. The method of claim 18 further comprising varying the current conducted through the N-channel switch proportionally with temperature.

21. The method of claim 18 further comprising varying the current conducted through the P-channel switch proportionally with temperature.

22. The method of claim 18 further comprising using a voltage at an output of the P-channel switch as the ON-voltage for a plurality of switches, the plurality of switches that control the coupling of a high reference voltage to the digital to analog converter.

23. The method of claim 18 further comprising using a voltage at an output of the N-channel switch as the ON-voltage for a plurality of switches, the plurality of switches that control the coupling of a low reference voltage to the digital to analog converter.

24. An electronic circuit comprising:
a first impedance control loop having a magnitude tracking an impedance value of a resistor;
a second impedance control loop having a magnitude tracking an impedance value of the resistor; and
wherein the first impedance control loop is used to provide an ON state voltage for a plurality of P-channel switches and the second impedance control loop is used to provide an ON state voltage for a plurality of N-channel switches.

25. The electronic circuit of claim 24, wherein the first impedance control loop is proportional to absolute temperature.

26. The electronic circuit of claim 24, wherein the second impedance control loop is proportional to absolute temperature.

27. A switch signal generator circuit comprising:
a first switch that controls a first reference gate voltage, the first reference gate voltage that is the ON state voltage for a first plurality of switches;
a second switch that controls a second reference gate voltage, the second reference gate voltage that is the ON state voltage for a second plurality of switches; and
a resistor, wherein each of an impedance value of the first switch and an impedance value of the second switch tracks an impedance value of the resistor.

28. A digital to analog converter comprising a switch signal generator circuit according to claim 27.

29. A digital to analog converter comprising:
a first plurality of switches configured for providing a high reference voltage to a binary ladder;
a second plurality of switches configured for providing a low reference voltage to the binary ladder; and
control circuitry configured for controlling impedance values of the first and second plurality of switches, the circuitry comprising:
a first switch configured for supplying a high reference gate voltage that is the ON state voltage for the first plurality of switches; and
a second switch configured for supplying a low reference gate voltage that is the ON state voltage for the second plurality of switches;
a reference resistor; and
a circuit configured for controlling impedance value of the first switch and impedance value of the second switch to track a current conducted by the reference resistor.

30. An electronic circuit comprising:
a first impedance control loop configured for controlling an impedance value of a first switch to track a current through a reference resistor;
a second impedance control loop configured for controlling an impedance value of a second switch to track the impedance value of the reference resistor; and
wherein the first impedance control loop provides an ON state voltage for a plurality of P-channel switches and the second impedance control loop provides an ON state voltage for a plurality of N-channel switches.

* * * * *